United States Patent
Seong et al.

(10) Patent No.: US 10,529,397 B2
(45) Date of Patent: Jan. 7, 2020

(54) MEMORY CHIP, PACKAGE DEVICE HAVING THE MEMORY CHIPS, AND OPERATING METHOD OF PACKAGE DEVICE

(71) Applicant: SK hynix Inc., Gyeonggi-do (KR)

(72) Inventors: Jin Yong Seong, Seoul (KR); Ho Jun Kang, Gyeonggi-do (KR); Sang Bin Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/984,803

(22) Filed: May 21, 2018

(65) Prior Publication Data

US 2019/0115052 A1 Apr. 18, 2019

(30) Foreign Application Priority Data

Oct. 12, 2017 (KR) .................. 10-2017-0132066

(51) Int. Cl.
| | |
|---|---|
| *G11C 8/06* | (2006.01) |
| *G11C 5/02* | (2006.01) |
| *G11C 5/04* | (2006.01) |
| *G11C 5/06* | (2006.01) |
| *H01L 23/00* | (2006.01) |
| *H01L 25/065* | (2006.01) |

(52) U.S. Cl.
CPC ............ *G11C 8/06* (2013.01); *G11C 5/025* (2013.01); *G11C 5/04* (2013.01); *G11C 5/063* (2013.01); *H01L 24/09* (2013.01); *H01L 25/0657* (2013.01)

(58) Field of Classification Search
CPC ....... G11C 5/025; G11C 16/08; G11C 15/046; G11C 8/12; G11C 8/06; G11C 2207/105; H01L 2225/06562; H01L 2225/06506; H01L 2924/1434; H01L 2224/48145; H01L 2224/32145; H01L 2224/04042; H01L 25/0657
See application file for complete search history.

(56) References Cited

U.S. PATENT DOCUMENTS

| | | | | |
|---|---|---|---|---|
| 8,811,055 | B2 * | 8/2014 | Yoon ................. | G11C 5/02 365/51 |
| 9,418,967 | B2 | 8/2016 | Koshiishi et al. | |
| 2010/0046265 | A1 * | 2/2010 | Chu ................... | G11C 5/147 365/49.17 |
| 2016/0148656 | A1 * | 5/2016 | Kim ................... | H01L 25/0657 365/51 |

FOREIGN PATENT DOCUMENTS

KR 101440568 9/2014

* cited by examiner

*Primary Examiner* — David Lam
(74) *Attorney, Agent, or Firm* — IP & T Group LLP

(57) ABSTRACT

Provided herein may be a memory chip, a package device having the memory chip, and a method of operating the package device. The memory chip comprising a plurality of memory blocks each including a plurality of memory cells for storing data; a plurality of input/output pads to which a chip address is inputted; and a plurality of peripheral circuits configured to program the chip address to a selected memory block among the memory blocks.

16 Claims, 9 Drawing Sheets

[AFTER PACKAGING]

[AFTER INPUT OF CHIP ADDRESS]

[READ CHIP ADDRESS]

MEMORY CHIP, PACKAGE DEVICE HAVING THE MEMORY CHIPS, AND OPERATING METHOD OF PACKAGE DEVICE

CROSS-REFERENCE TO RELATED APPLICATION

The present application claims priority under 35 U.S.C. § 119(a) to Korean patent application number 10-2017-0132066 filed on Oct. 12, 2017, the entire disclosure of which is incorporated herein by reference.

BACKGROUND

Field of Invention

Various embodiments of the present disclosure generally relate to a memory chip, a package device employing the memory chip, and an operating method thereof. More particularly, the present invention relates to a multi-chip package device.

Description of Related Art

Because of recent advances in the semiconductor industry and the needs of users, there is a growing emphasis in developing increasingly smaller size and weight electronic devices. For example, one avenue that is being explored actively, includes various multi-chip package devices in which a plurality of memory chips are mounted in a single package device.

Multi-chip package devices may be used primarily for cellular smart phones which need reduced size and weight. Compared to single-chip package devices, the multi-chip package devices may generally provide higher memory capacity, and speed and make it possible to reduce the overall cost associated with cellular smart phone. In sum, recently, research and development efforts on multi-chip package devices in which two or more memory chips are stacked in a single package have increased appreciably.

SUMMARY

Various embodiments of the present disclosure are directed to an improved multi-chip package device having reduced size while maintaining or even exhibiting improved capacity and speed. The multi-chip package device employs a novel memory chip that reduces the size of the multi-chip package device, to a package device employing the memory chip and an operating method thereof.

An embodiment of the present disclosure provides a memory chip including: a plurality of memory blocks each including a plurality of memory cells for storing data; a plurality of input/output pads to which a chip address is inputted; and a plurality of peripheral circuits configured to program the chip address to a selected memory block among the memory blocks.

An embodiment of the present disclosure provides a package device comprising a plurality of memory chips, each including memory blocks to which different chip addresses are stored, and enable input pads and enable output pads to which signals for indicating input states of the chip addresses are applied. Each of the memory chips may include any one of the enable input pads, and any one of the enable output pads. The enable input pad included in each of the memory chips may be coupled to the enable output pad of a corresponding one of the other memory chips. In response to signals applied to the enable input pads and the enable output pads, the chip addresses may be successively inputted to the memory chips.

An embodiment of the present disclosure provides for method of operating a package device, including: a packaging operation of coupling enable input pads and enable output pads included in a plurality of memory chips to each other; and successively programming chip addresses to the memory chips by controlling signals to be applied to the enable input pads and the enable output pads.

An embodiment of the present disclosure provides a multi-chip package device, comprising: a plurality of memory chips stacked on top of each other, each memory chip, comprising: a memory region comprising a plurality of memory blocks, a plurality of circuits, and a control circuit configured to control the peripheral circuits to program a chip address to a selected memory block, and a pad region comprising a plurality of input and output pads.

These and other features and advantages of the present invention will become apparent to those with ordinary skill in the art to which the present invention belongs from the following description in conjunction with the accompanying drawings.

DETAILED DESCRIPTION

Figure 1:
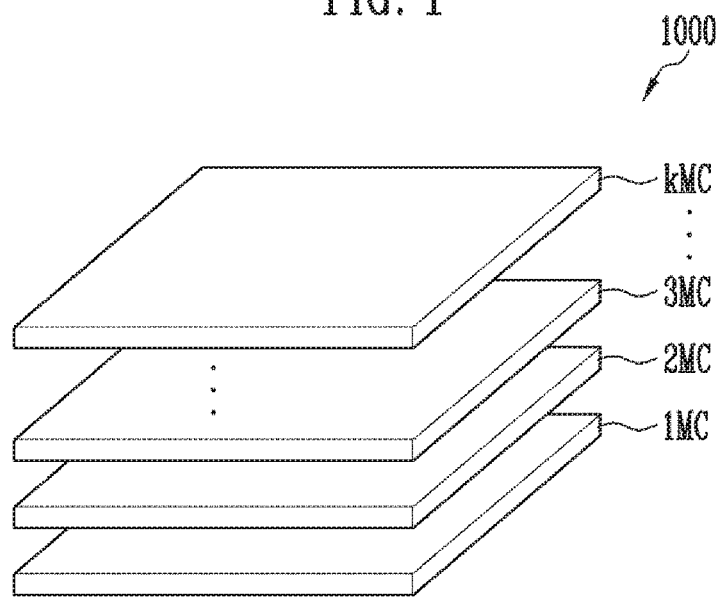
FIG. 1 is a diagram illustrating a multi-chip package device, in accordance with an embodiment of the present disclosure.

Exemplary embodiments of the present invention will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having Idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram Illustrating a multi-chip package device 1000, in accordance with an embodiment of the present disclosure.

Referring to FIG. 1, the multi-chip package device 1000 may include first to k-th memory chips 1MC to kMC (k is a positive integer). In other words, a plurality of memory chips may be mounted in a single package, and such a package may be called a multi-chip package. For Instance, a package including a single memory chip is referred to as a single chip package (SDP), a package including two memory chips is referred to as a dual chip package (DDP), a package including four memory chips is referred to as a quarter chip package (QDP), and packages including two or more memory chips are integrally referred to as a multi-chip package (MCP).

For example, the MCP illustrated in FIG. 1 may include 2 or more chips. In an embodiment the MCP of FIG. 1 may be a QDP.

The first to k-th memory chips 1MC to kMC may be disposed substantially parallel to each other, and stacked on top of one another to reduce the surface area of the multi-chip package device 1000. User data may be stored to each of the first to k-th memory chips 1MC to kMC. Chip addresses may be stored to each of the first to k-th memory chips 1MC to kMC so as to distinguish them from each other.

The configurations of the first to k-th memory chips 1MC to kMC may be similar to each other, so that only the k-th memory chip kMC will be described herein in detail by way of example.

Figure 2:
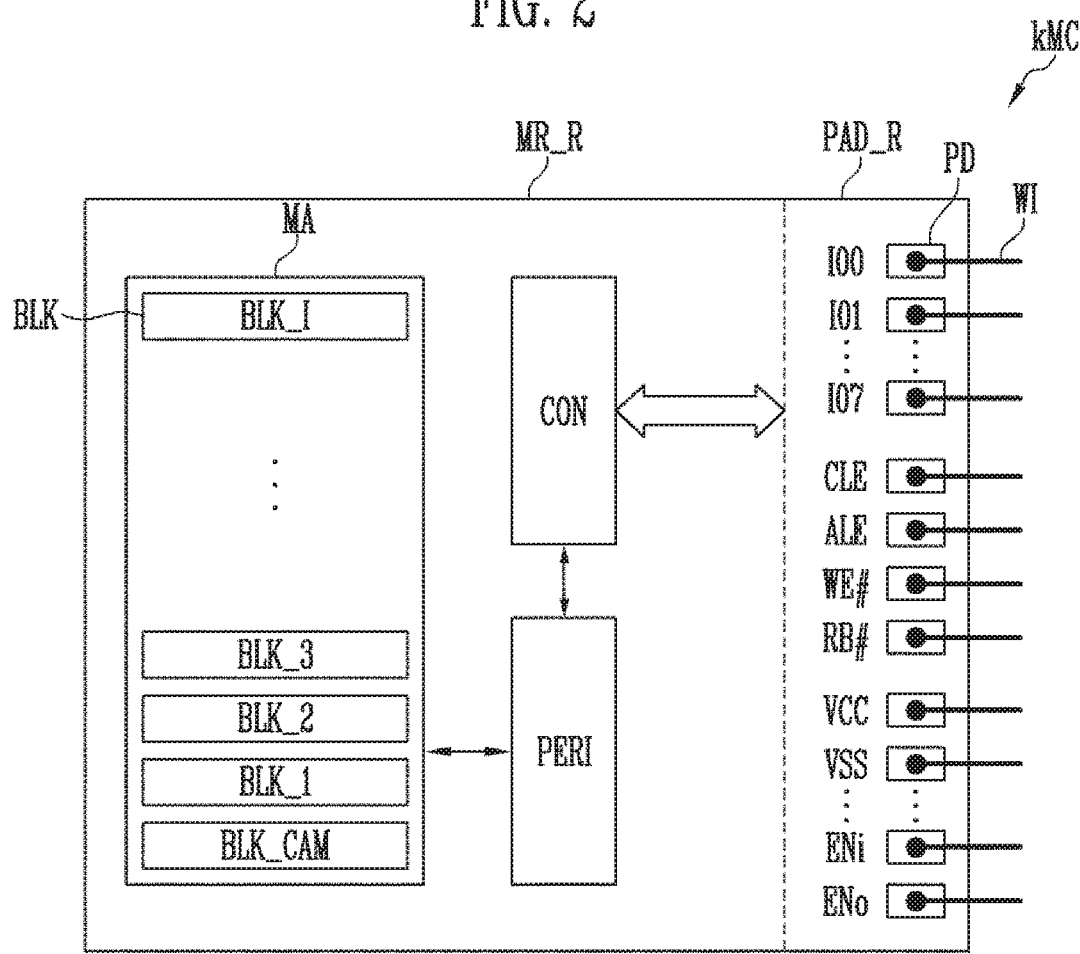
FIG. 2 is a diagram illustrating an exemplary configuration of a memory chip mounted in the multi-chip package device shown in FIG. 1, in accordance with an embodiment of the present disclosure.

FIG. 2 is a diagram illustrating the kMC mounted in the multi-chip package device 1000 of FIG. 1, in accordance with an embodiment of the present disclosure.

Referring now to FIG. 2, the k-th memory chip kMC may be divided into a pad region PAD_R and a memory region MR_R.

A plurality of pads PD for communicating with the other memory chips or with a host may be disposed in the pad region PAD_R. At least one wire WI may be coupled to each of the pads PD. For example, different memory chips may be electrically coupled to each other by the wires WI.

The pads PD formed in the pad region PAD_R may include input/output pads 100 to 107, a command latch enable pad CLE, an address latch enable pad ALE, a write enable pad WE #, a ready/busy pad RB #, a supply voltage pad VCC, a ground voltage pad VSS, an enable input pad ENi, and an enable output pad ENo, which are classified according to their use purpose.

The input/output pads 100 to 107 may be used to transmit and/or receive at least one of a command, an address and data. The command latch enable pad CLE may be used to transmit and/or receive a signal to enable a command register. The address latch enable pad ALE may be used to transmit and/or receive a signal to enable an address register. The write enable pad WE # may be used to transmit and/or receive a clock for transmitting a command, an address or data. The ready/busy pad RB # may be used to transmit and/or receive a signal indicating the state of a memory chip. The supply voltage pad VCC may be used to supply and/or receive a supply voltage to the memory chips. The ground voltage pad VSS may be used to supply and/or receive a ground voltage to the memory chips. Signals for indicating an input state of a chip address may be applied to the enable input pad ENi and the enable output pad ENo, and the signals may be used to select a memory chip during a chip address input operation. For example, until the chip address input operation of the selected memory chip is completed, the level of a signal to be output through the enable output pad ENo of the selected memory chip may be opposite to that of a signal applied to the enable input pad ENi. It is noted that only the pads PD needed in the present embodiment have been illustrated in FIG. 2, however, other various pads may be further included without departing from the scope of the present invention.

The memory region MR_R may include a memory cell array MA configured to store data, peripheral circuits PERI configured to perform at least one of a program operation, a read operation, an erase operation, and other background operations of the memory chip and a control circuit CON operatively coupled to the pad region PAD_R and the PERI circuits. The control circuit may, for example, be configured to communicate with the pads PD and to control the peripheral circuits PERI. The peripheral circuits may include an input/output circuit configured to exchange a command, an address, and data with the pads, and page buffers configured to temporarily store a chip address to be programmed. Detailed description of the various components of the PERI circuits will be omitted since such circuits are well known in the art.

The memory cell array MA may include a plurality of memory blocks BLK for storing data. The memory blocks BLK may include a plurality of normal memory blocks BLK_1 to BLK_I, and at least one memory block BLK used as a CAM (Content Addressable Memory) block BLK_CAM for storing data to be used in the memory chip kMC. The normal memory blocks BLK_1 to BLK_I and the CAM block BLK_CAM may have the same physical configuration.

Various information about the operation of the memory chip kMC may be stored to a CAM block BLK_CAM of the memory chip KMC. For example, a chip address may be stored to a CAM block BLK_CAM. In the case where a plurality of memory chips are included in a single package device, a plurality of different chip addresses may be stored in the at least one CAM block BLK_CAM. For example, each chip address may correspond to a different memory chip in the multi-chip package 1000.

Figure 3:
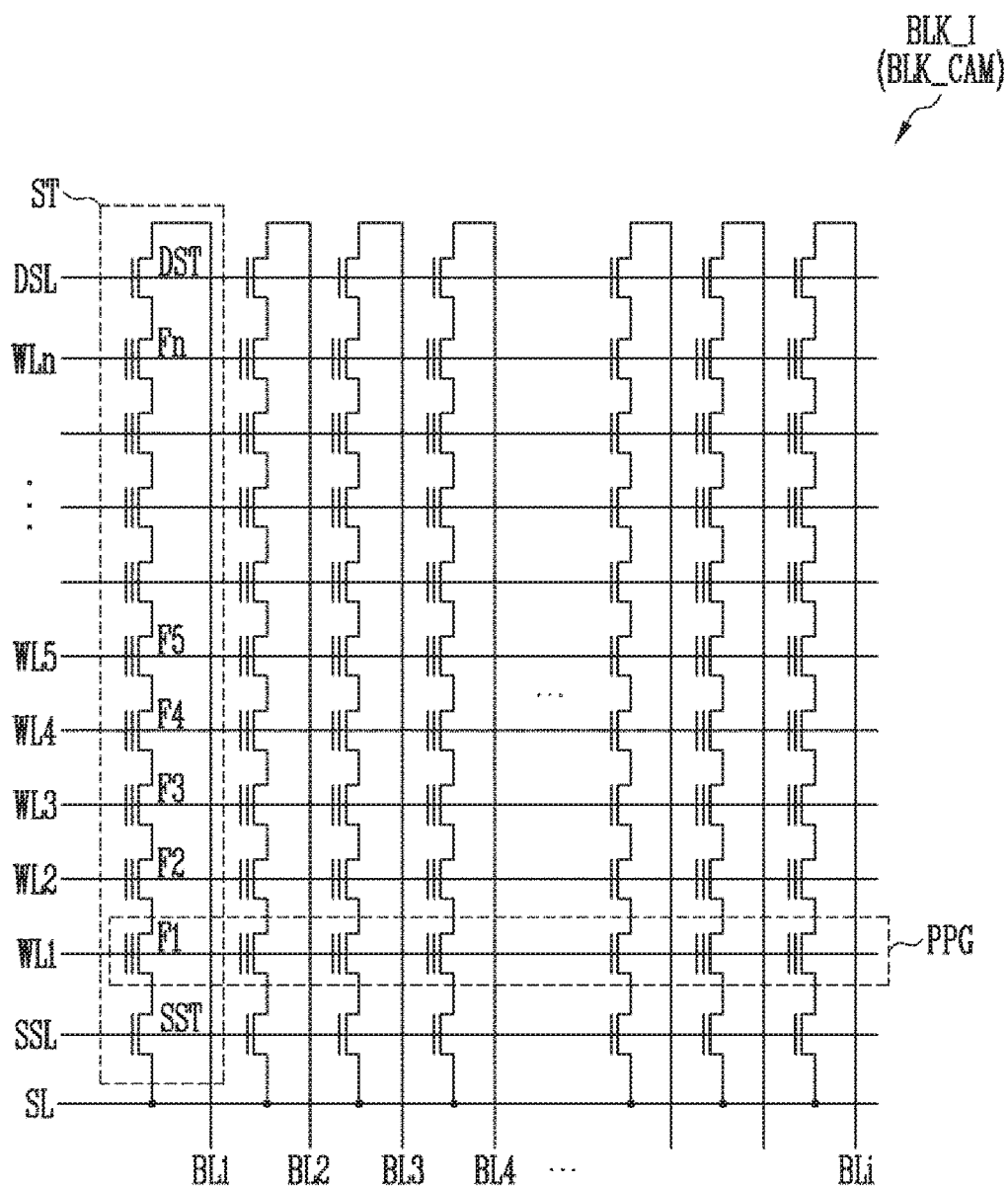
FIGS. 3 to 5 are diagrams illustrating various examples of a memory block, in accordance with an embodiment of the present disclosure.
Figure 4:
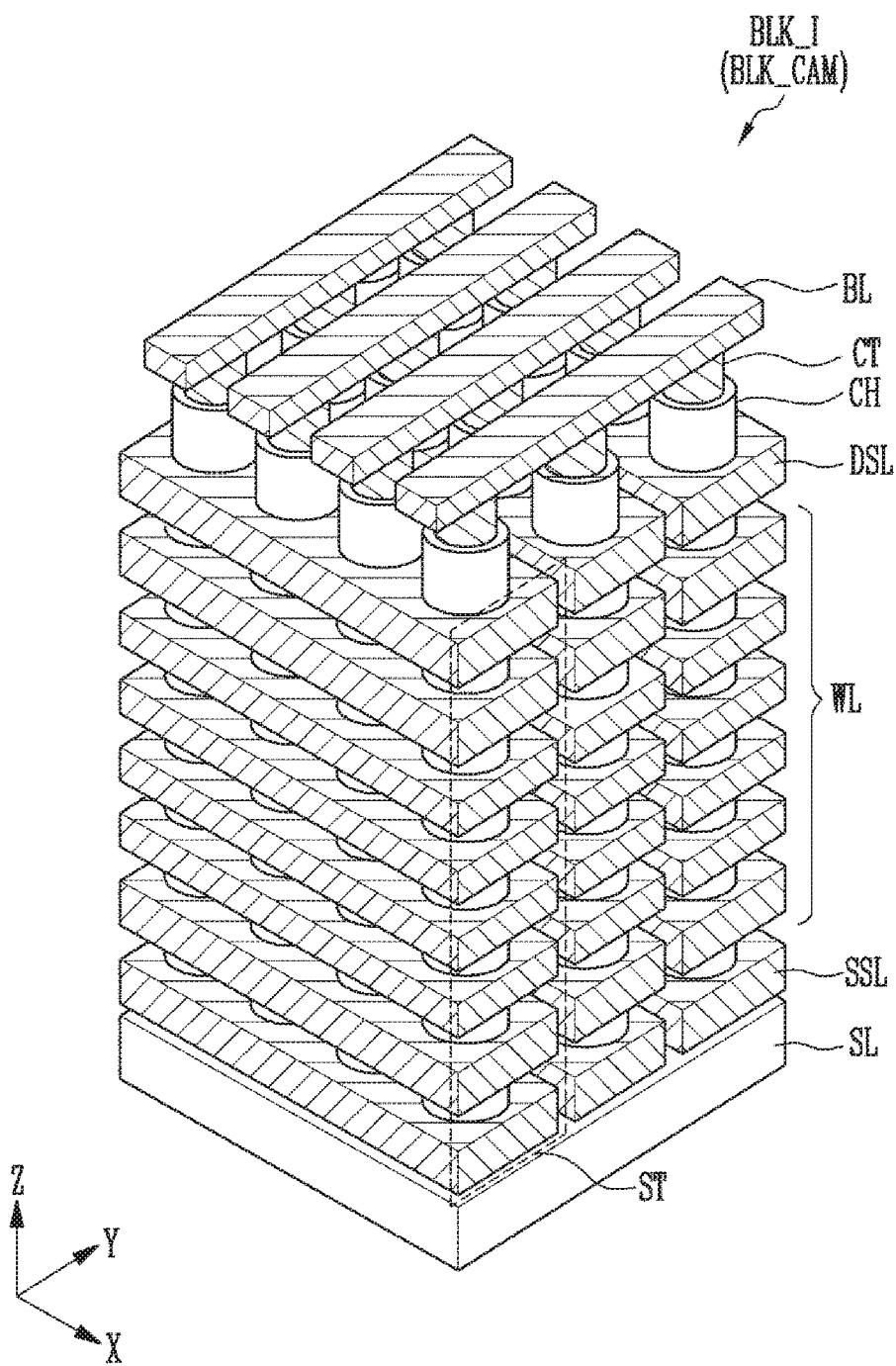
Figure 5:
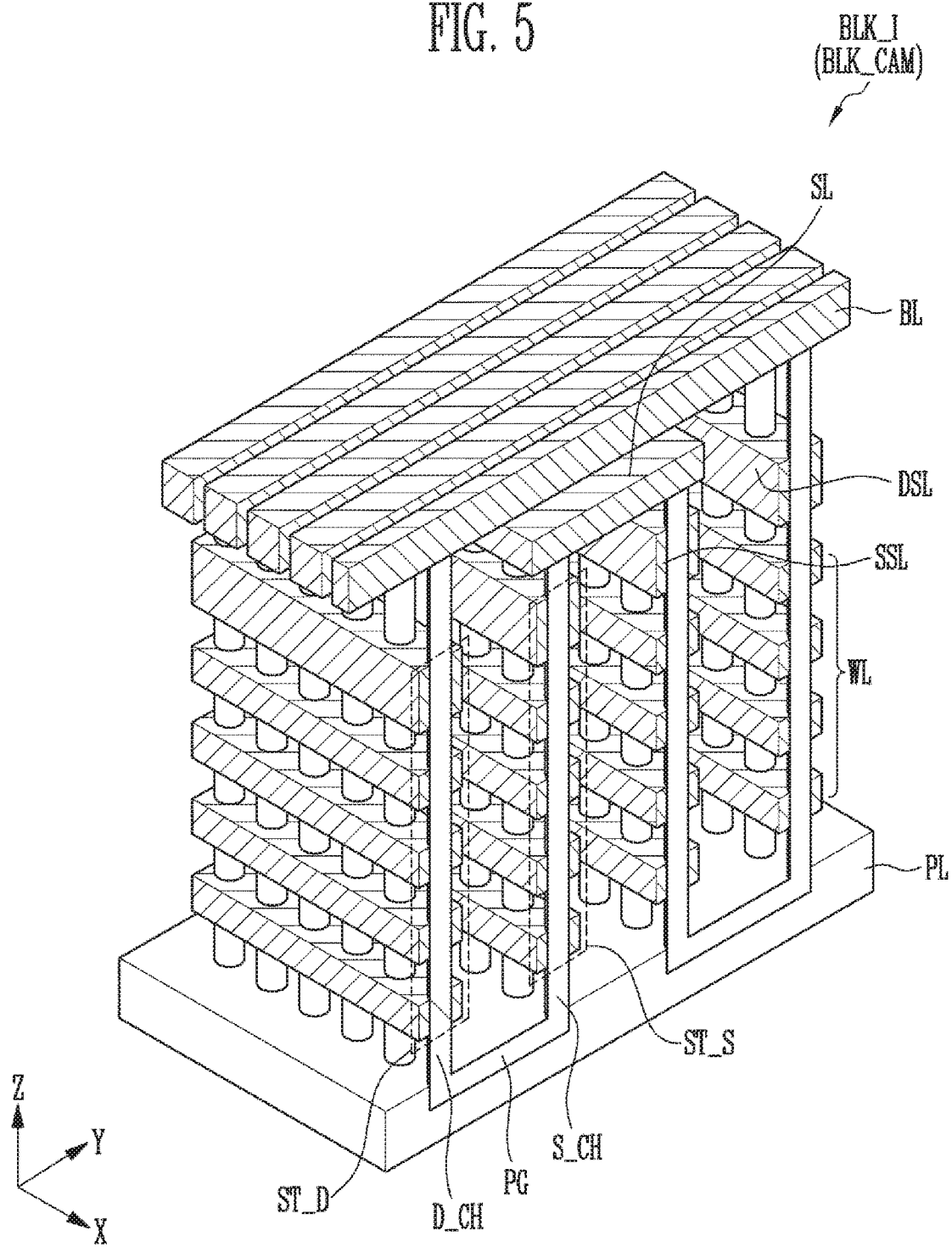

FIGS. 3 to 5 are diagrams illustrating various examples of a memory block in accordance with an embodiment of the present disclosure.

Referring to FIG. 3, any one memory block of the memory blocks BLK_1 to BLK_I and BLK_CAM shown in FIG. 2 will be described by way of example. The memory block shown in FIG. 3 may be any one of the normal memory blocks BLK_1 to BLK_I or the cam block BLK_CAM.

The memory block BLK_I or BLK_CAM may include a plurality of cell strings ST, each being coupled between a bit line among the plurality of bit lines BL1 to BLi and a source line SL. Hence, the cell strings ST may be coupled to their respective bit lines BL1 to BLi and coupled in common to the source line SL. The configurations of the cell strings ST may be similar to each other, hence only one cell string ST coupled to the first bit line BL1 will be described herein in detail by way of example.

Accordingly, cell string ST may include a source select transistor SST, first to n-th memory cells F1 to Fn (n is a positive integer), and a drain select transistor DST, which are coupled in series to each other between the source line SL and the first bit line BL1. The number of source and drain select transistors SST and DST is not limited to that shown in FIG. 3. The source select transistor SST may be coupled between the source line SL and a first memory cell F1. The first to n-th memory cells F1 to Fn may be coupled in series between the source select transistor SST and the drain select transistor DST. The drain select transistor DST may be coupled between the n-th memory cell Fn and the first bit line BL1. Although not shown, dummy cells may be further coupled between the memory cells F1 to Fn or between the source select transistor SST and the drain select transistor DST.

Included in different cell strings ST, the gates of the source select transistors SST may be coupled to a source select line SSL, gates of the first to n-th memory cells F1 to Fn may be respectively coupled to first to n-th word lines word lines WL1 to WLn, and gates of the drain select transistors DST may be coupled to a drain select line DSL. A group of memory cells coupled to each of the word lines WL1 to WLn may be referred to as a physical page PPG. For example, among the memory cells F1 to Fn included in different cell strings ST, a group of first memory cells F1 coupled to the first word lines WL1 may form a single physical page PPG. In a multi-level cell (MLC) type program operation, a plurality of logical pages may be included in a single physical page PPG. For example, first data and second data may be stored in the single physical page PPG. The first data may be least significant bit (LSB) data, and the second data may be most significant bit (MSB) data.

Referring to FIG. 4, the memory block BLK_I or BLK_CAM may have a three-dimensional structure.

The memory block BLK_I or BLK_CAM having a three-dimensional structure may be formed in a vertical (Z-directional) I shape on a substrate, and include a plurality of cell strings ST arranged between each bit line BL and the source line SL. A well may be formed in lieu of the source line SL. This structure is called a bit cost scalable (BiCS) structure. For example, in the case where the source line SL is horizontally formed on the substrate, the cell strings ST having a BiCS structure may be formed over the source line SL in the vertical direction (Z-axis direction).

In more detail, the cell strings ST may be arranged in a spaced relationship in rows and columns along a first direction (an X-axis direction) and a second direction (a Y-axis direction). Each of the cell strings ST may include source select liens SSL, word lines WL, and drain select lines DSL which are stacked at positions spaced apart from each other. The number of source select lines SSL, the number of word lines WL, and the number of drain select lines DSL are not limited to those shown in the drawing, and may be changed depending on the structure of the memory chip. The cell strings ST may include vertical channel layers CH which vertically pass through the source select lines SSL, the word lines WL and the drain select lines DSL, and bit lines BL which come into contact with upper ends of the vertical channel layers CH protruding upward from the drain select lines DSL and extend in the second direction (Y-axis direction). The memory cells may be formed between the word lines WL and the vertical channel layers CH. Contact plugs CT may be further formed between the bit lines BL and the vertical channel layers CH.

Referring to FIG. 5, the memory block BLK_I or BLK_CAM may have a three-dimensional structure different from that of FIG. 4.

The memory block BLK_I or BLK_CAM having a three-dimensional structure may be formed in a vertical (Z-directional) U shape on a substrate, and include source strings ST_S and drain strings ST_D which are coupled between the bit lines BL and the source line SL and make pairs. Each source string ST_S and the corresponding drain string ST_D may be coupled to each other through a pipe gate PG to form a U shape. The pipe gate PG may be formed in a pipe line PL. In detail, the source strings ST_S may be vertically formed between the source line SL and the pipe line PL. The drain strings ST_D may be vertically formed between the bit lines BL and the pipe line PL. This structure may be called a pipe-shaped bit cost scalable (P-BiCS) structure.

In more detail, the drain strings ST_D and the source strings ST_S may be arranged in a first direction (an X-axis direction) and a second direction (a Y-axis direction). The drain strings ST_D and the source strings ST_S may be alternately arranged in the second direction (Y-axis direction). The drain strings ST_D may include word lines WL and a drain select line DSL which are stacked at positions spaced apart from each other, and vertical drain channel layers D_CH which vertically pass through the word lines WL and the drain select line DSL. The source strings ST_S may include word lines WL and a source select line SSL which are stacked at positions spaced apart from each other, and vertical source channel layers S_CH which vertically pass through the word lines WL and the source select line SSL. The vertical drain channel layers D_CH and the vertical source channel layers S_CH may be coupled to each other by the pipe gates PG in the pipe line PL. The bit lines BL may come into contact with upper ends of the vertical drain channel layers D_CH that protrude upward from the drain select line DSL, and may extend in the second direction (Y-axis direction).

The memory blocks MBk may be embodied in various structures, as well as in the structures described with reference to FIGS. 3 to 5.

Figure 6:
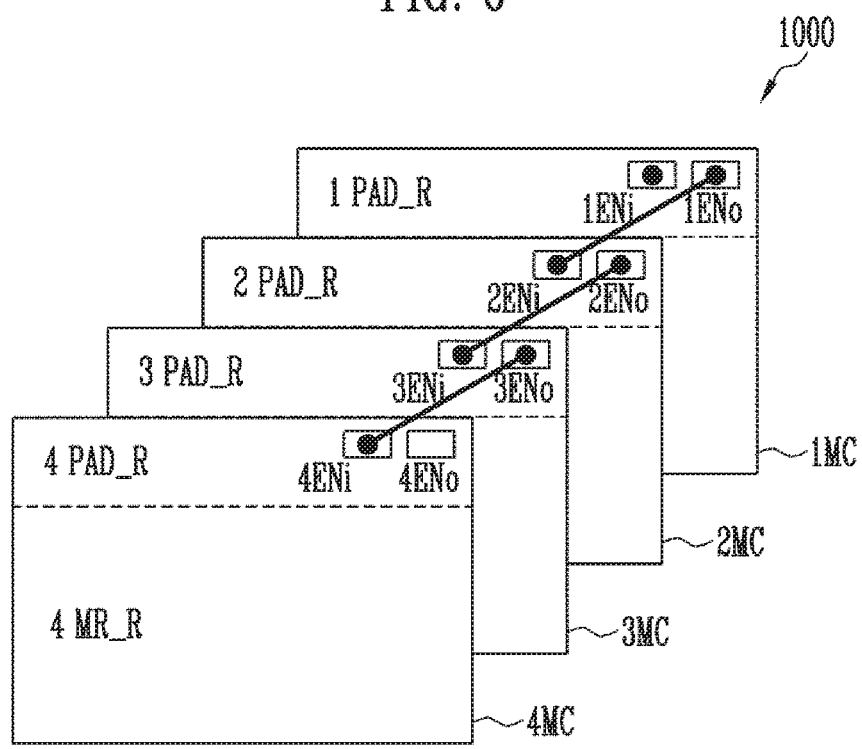
FIG. 6 is a diagram illustrating a coupling configuration of the memory chips shown in FIG. 1, in accordance with an embodiment of the present disclosure.

FIG. 6 is a diagram illustrating a coupling configuration of four memory chips 1MC to 4MC in the multi-package device 1000, in accordance with an embodiment of the present disclosure.

Referring now to FIG. 6, a plurality of stacked memory chips 1MC to 4MC may be mounted in the package device 1000. Although the structure in which the four memory chips 1MC to 4MC are mounted in the single package device 1000 is illustrated in FIG. 6 by way of example, the number of memory chips 1MC to 4MC is not limited thereto.

The first memory chip 1MC may be disposed at the lowermost position, and the second to fourth memory chips 2MC to 4MC may be successively stacked over the first memory chip 1MC. The first to fourth memory chips 1MC to 4MC may include pad regions 1PAD_R to 4PAD_R and memory regions 1MR_R to 4MR_R. First to fourth enable input pads 1ENi to 4ENi and first to fourth enable output pads 1ENo to 4ENo may be formed in pairs in the pad regions 1PAD_R to 4PAD_R. For example, the first enable input pad 1ENi and the first enable output pad 1ENo may be disposed as a pair in the first pad region 1PAD_R of the first memory chip 1MC. The second enable input pad 2ENi and the second enable output pad 2ENo may be disposed as a pair in the second pad region 2PAD_R of the second memory chip 2MC. Likewise, in the third and fourth pad regions 3PAD_R and 4PAD_R of the other third and fourth memory chips 3MC and 4MC, the third and fourth enable input pads 3ENi and 4ENi and the third and fourth enable output pads 3ENo and 4ENo may make respective pairs.

The enable output pad of a memory chip among the plurality of memory chips 1MC to 4MC may be coupled to the enable input pad of an immediately adjacent memory chip. The first to fourth memory chips 1MC to 4MC may be coupled to each other through such a coupling relationship. For example, the first enable output pad 1ENo of the first memory chip 1MC may be coupled to the second enable input pad 2ENi of the second memory chip 2MC. The second enable output pad 2ENo of the second memory chip 2MC may be coupled to the third enable input pad 3ENi of the third memory chip 3MC. In the same manner, the fourth enable input pad 4ENi of the fourth memory chip 4MC that is disposed at the uppermost position may be coupled to the third enable output pad 3ENo of the third memory chip 3MC. When the enable input pads and the enable output pads are coupled to each other in the above-mentioned manner, the first enable input pad 1ENi of the first memory chip 1MC and the fourth enable output pad 4ENo of the fourth memory chip 4MC are not coupled to any other memory chips.

Signals to be applied to the enable input pad and the enable output pad of a selected memory chip to input a chip address may have opposite levels. Signals of the enable input pad and the enable output pad of a memory chip to which the chip address has been applied may have the same level. Signals of the enable input pad and the enable output pad of a memory chip which is waiting for input of a chip address may also have the same level. Signals having the opposite levels may be respectively applied to the memory chip to which the chip address has been applied and the memory chip which is waiting for input of the chip address.

For example, high-level signals may be applied to the enable input pad and the enable output pad of the memory chip to which the chip address has been input, and low-level signals may be applied to the input pad and the enable output pad of the memory chip which is waiting for input of a chip address.

In other words, depending on signals applied to the enable input pad and the enable output pad, the state in which a chip address is entered to the memory chip may be determined. For instance, when a chip address input operation of a selected memory chip is completed, the selected memory chip may generate, as an internal output, a signal having a level opposite to that of the input signal to the enable input pad, and output the generated internal output through the enable output pad.

The first enable input pad 1ENi of the first memory chip 1MC may float because it is not coupled to any of the other memory chips. For example, the internal output of the first enable input pad 1ENi of the first memory chip 1MC may remain at a positive voltage level.

A sequence of the chip address input operation of the first to fourth memory chips 1MC to 4MC will be described below.

Figure 7:
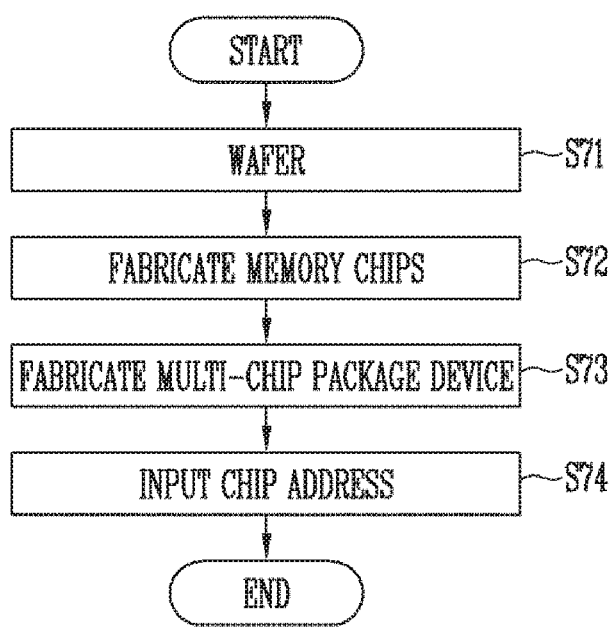
FIG. 7 is a flowchart illustrating a chip address input method of the multi-chip package device shown in FIG. 1, in accordance with an embodiment of the present disclosure.

FIG. 7 is a flowchart illustrating a chip address input method of the multi-chip package device 1000, in accordance with an embodiment of the present disclosure.

Referring to FIG. 7, in an embodiment, a chip address may be stored in the memory region of a memory chip, hence the chip address input operation may be performed after the multi-chip package is formed.

In detail, a wafer for forming memory chips may be provided, at step S71. Thereafter, the memory chips may be formed on the wafer through a memory fabrication process, at step S72. A multi-chip package device may be fabricated by stacking the memory chips formed on the wafer on top of one another and performing a packaging process, at step S73. Subsequently, chip addresses may be entered to the memory chips which are included in the single multi-chip package device, at step S74. The chip addresses may be stored to the respective memory regions of the memory chips, and more particularly in the at least one cam block (BLK_CAM of FIG. 2) formed in the memory region of each memory chip.

A method of storing the chip addresses to the respective memory chips will be described in more detail below.

Figure 8:
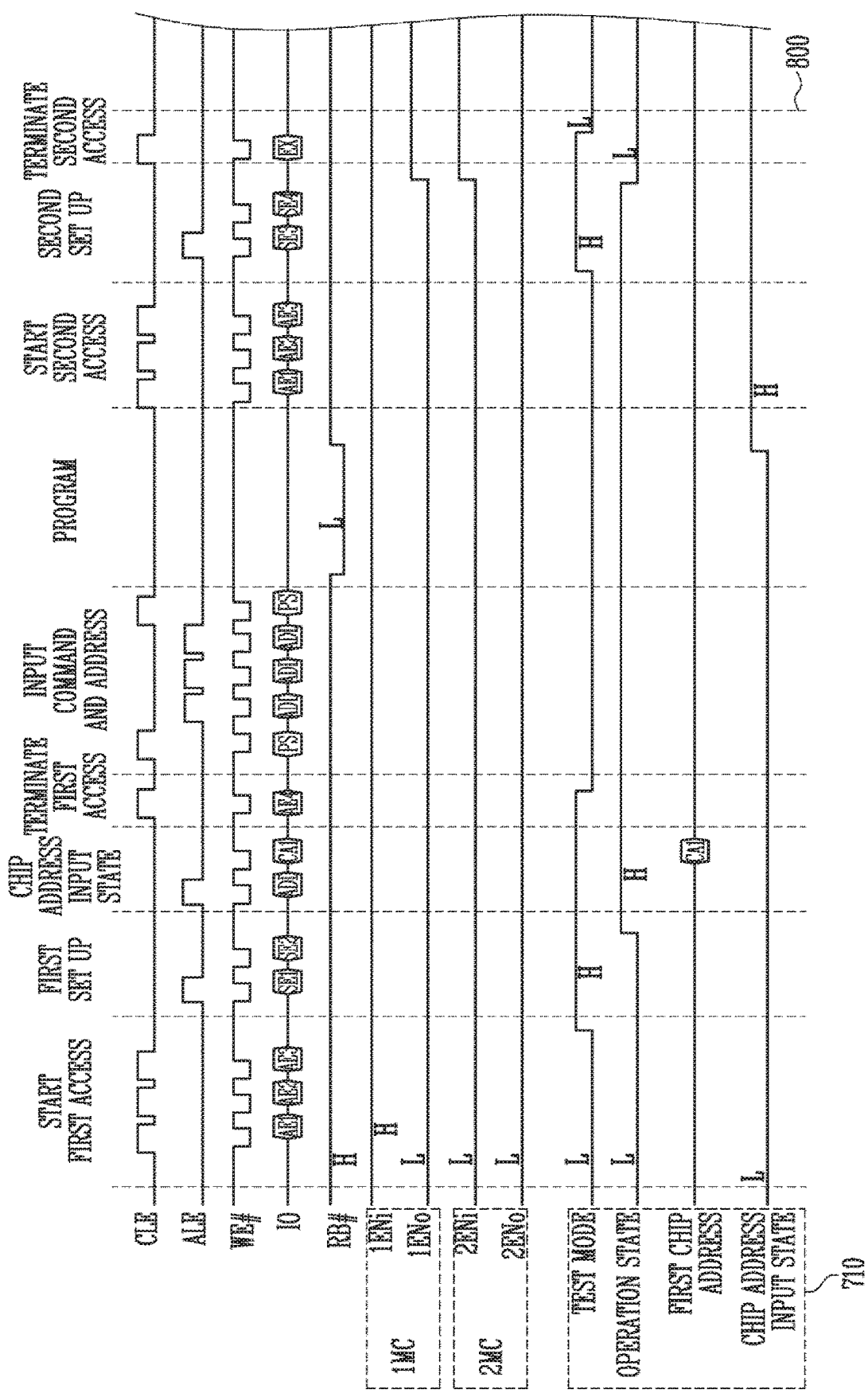
FIGS. 8 and 9 are timing diagrams illustrating in detail the chip address input method, in accordance with an embodiment of the present disclosure.
Figure 9:
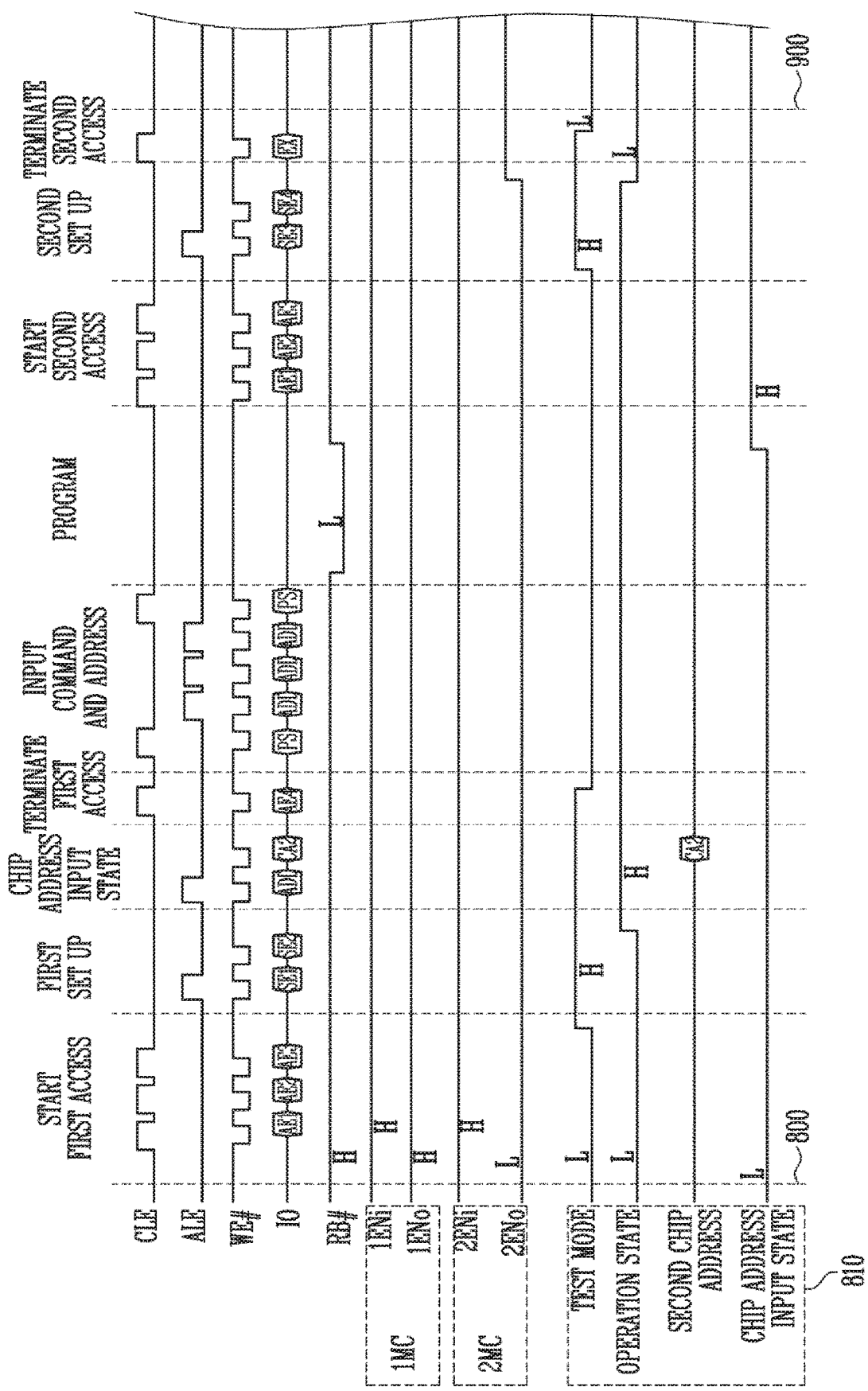

FIGS. 8 and 9 are timing diagrams illustrating in detail the chip address input method in accordance with an embodiment of the present disclosure. In FIGS. 8 and 9, it is assumed that a chip address is first provided to the first memory chip 1MC, and a chip address is subsequently inputted to the second memory chip 2MC.

Referring to FIG. 8, a chip address may be first inputted to the first memory chip 1MC. Because the first enable Input pad 1ENi of the first memory chip 1MC floats at a high-level H and a low-level (L) signal is applied to the first enable output pad 1ENo, the chip address is allowed to be entered to the first memory chip 1MC.

If a first access start period starts, first access start commands AE1 to AE3 may be loaded to the input/output pads IO. Each time a clock applied to the write enable pad WE # makes a transition from a low-level L to a high-level H after a high-level (H) pulse has been applied to the command latch enable pad CLE, the first access start commands AE1 to AE3 may be provided to the control circuit (CON of FIG. 2). Here, because the second memory chip 2MC is an unselected chip, both the potential of the second enable input pad 2ENi of the second memory chip 2MC and the potential of the second enable output pad 2ENo remain at a low-level L. The commands may be received from a memory controller configured to control the memory chips, and an operation, which will be described below, may be performed under the control of the control circuit CON.

Reference numeral '710' of FIG. 8 denotes a box provided to explain the state of the first memory chip 1MC, and illustrates a test mode, an operation state, and a chip address input state. In box '710', L (low-level) represents a disabled state, and H (high-level) represents an enabled state. For example, when the test mode is at the low-level L, this means that the first memory chip 1MC is not in the test mode. When the test mode is at the high-level H, this means that the first memory chip 1MC is in the test mode. Here, the test mode is a chip test mode which is performed after the packaging. Although, in an embodiment, chip addresses may be entered to the memory chips at a package test step, it is not limited to the test mode.

If all of the first access start commands AE1 to AE3 are inputted, the test mode of the first memory chip 1MC is enabled (H), and a first set-up period may start. While the first access start period is a period in which the first memory chip 1MC is accessed, the first set-up period may be a period in which the first memory chip 1MC sets up various conditions needed for the chip address input operation. In other words, in the first set-up period, various parameters needed for the chip address input operation may be set up. For example, when the potential of the address latch enable pad ALE is at the high-level H and a clock is applied to the write enable pad WE #, first and second set-up commands SE1 and SE2 loaded to the input/output pads IO may be provided to the first memory chip 1MC.

If both the first and second set-up commands SE1 and SE2 are entered to the first memory chip 1MC, the first memory chip 1MC is allowed to perform the chip address input operation, so that the operation state thereof is enabled (H), and a chip address input period may start.

When the chip address input period starts, the potential of the address latch enable pad ALE makes a transition to a high-level H and a clock is applied to the write enable pad WE #. Then, chip addresses ADD and CA1 may be provided to the first memory chip 1MC through the input/output pads IO. When the address of the first memory chip 1MC refers to a first chip address CA1, the first chip address CA1 may be temporarily stored to the control circuit CON of the first memory chip 1MC. Here, not only the first chip address CA but also other addresses ADD related to the first memory chip 1MC may be inputted to the first memory chip 1MC. The above-mentioned addresses may be received from the memory controller configured to control the memory chips.

When the first chip address CA1 is provided to the first memory chip 1MC, the test mode of the first memory chip 1MC is disabled (L), so that the first access step may be terminated. Thereafter, an operation of inputting the first chip address CA1 to the memory region of the first memory chip 1MC may be performed.

For example, the first chip address CA1 may be provided to the memory region of the first memory chip 1MC through a program operation. To this end, in response to a clock to be applied to the write enable pad WE # when the potential of the command latch enable pad CLE is at the high-level H, a program command PS may be entered to the first memory chip 1MC. In addition, in response to a clock to be applied to the write enable pad WE # when the potential of the address latch enable pad ALE is at the high-level H, the addresses ADD may be provided to the first memory chip 1MC. Here, the addresses ADD which are inputted to the first memory chip 1MC may be addresses of a plane, a memory block and a page to which the first chip address CA1 is to be programmed. For example, the cam block (CLK_CAM of FIG. 2) included in the first memory chip 1MC may be selected. If all of the addresses ADD are inputted, the program command PS is inputted so that the program operation may be performed.

While the program operation of the first memory chip 1MC is performed, the potential of the ready/busy pad RB # transition to the low-level L indicating a busy state.

When the program operation of the first chip address CA1 is completed, the chip address input state of the first memory chip 1MC may be enabled (H). When the chip address input state of the first memory chip 1MC is enabled (H), the potential of the ready/busy pad RB # transitions to the high-level H indicating a ready state again. When the first chip address CA1 is stored to the first memory chip 1MC, a second access start period may start so as to terminate the access to the first memory chip 1MC. In other words, the second access start period may be a period in which the first memory chip 1MC is accessed to release the first access, rather than being a period in which the first memory chip 1MC is re-accessed. In the same manner as the first access start period, first access start commands AE1 to AE3 may also be provided to the first memory chip 1MC during the second access period. Because the first access start commands AE1 to AE3 are also inputted to the first memory chip 1MC during the second access start period, the test mode of the first memory chip 1MC may be re-enabled (H), and a second set-up period may start. While the second access start period is a period in which the first memory chip 1MC is accessed, the second set-up period may be a period in which the first memory chip 1MC sets up various conditions for terminating the chip address input operation. In other words, in the second set-up period, various parameters for terminating the chip address input operation may be set up. For example, when the potential of the address latch enable pad ALE is at the high-level H and a clock is applied to the write enable pad WE #, third and fourth set-up commands SE3 and SE4 loaded to the input/output pads IO may be provided to the first memory chip 1MC.

If both the third and fourth set-up commands SE3 and SE4 are inputted to the first memory chip 1MC, the first memory chip 1MC is allowed to perform the chip address input termination operation, so that the operation state thereof is disabled (L). When the operation state of the first memory chip 1MC is disabled, the potential of the first enable output pad 1ENo of the first memory chip 1MC may transition to the high-level H. If both the potential of the first enable input pad 1ENi and the potential of the second enable output pad 1ENo transition to a high-level H, a termination command EX may be provided to the first memory chip 1MC during a second access termination period in which the access of the first memory chip 1MC is substantially terminated. When the termination command EX is inputted to the first memory chip 1MC, the test mode of the first memory chip 1MC may be disabled.

When the potential of the first enable output pad 1ENo of the first memory chip 1MC makes a transition to the high-level H, the potential of the second enable input pad 2ENi of the second memory chip 2MC makes a transition to the high-level H in synchronization with the potential of the first enable output pad 1ENo.

Because the potential of the second enable input pad 2ENi of the second memory chip 2MC is at the high-level H and the potential of the second enable output pad 2ENo is at the low-level L, a chip address can be provided to the second memory chip 2MC, as shown by reference numeral 800. In other words, when the first chip address CA1 Is stored into the first memory chip 1MC, a second chip address may be subsequently prepared to be provided to the second memory chip 2MC. Here, the second chip address CA2 may be an address that is different from the first chip address CA1.

Referring to FIG. 9 there is illustrated a method of inputting the second chip address CA2 to the second memory chip 2MC. The method of providing the second chip address CA2 to the second memory chip 2MC may be performed in a manner similar to the operation of entering the first chip address CA1 to the first memory chip 1MC. For example, the method of inputting the second chip address CA2 to the second memory chip 2MC may be performed in the same manner as that of FIG. 8, other than the fact that the second chip address CA2 is provided to the second memory chip 2MC; therefore, repetitive description will be omitted. Reference numeral '810' of FIG. 9 denotes a box provided to explain the state of the second memory chip 2MC, and illustrates a test mode, an operation state, a second chip address and a chip address input state. In other words, box '810' is similar to '710' explained in the description of FIG. 8, other than the fact that a target thereof is the second memory chip 2MC in lieu of the first memory chip 1MC.

Even in the case of the second memory chip 2MC, when an operation of inputting the second chip address CA2 is completed, both the internal output of the second enable input pad 2ENi and the potential of the second enable output pad 2ENo transition to a high-level H, as shown by reference numeral 900. Hence, a chip address input operation of a subsequent memory chip (e.g., the third memory chip) may be successively performed. In the above-mentioned manner, different chip addresses may be successively stored to the first to fourth memory chips 1MC to 4MC, respectively. If all of the chip addresses are stored to the first to fourth memory chips 1MC to 4MC, all of the potentials of the enable input pads and the enable output pads of the first to fourth memory chips 1MC to 4MC transition to the high-level H.

The commands and the addresses described with reference to FIGS. 8 and 9 are only examples used to describe the chip address input operation according to the present disclosure; therefore, the commands and the addresses may be modified in various ways without departing from the scope of the present invention.

A sequence along which the chip addresses are stored to the respective memory chips through the chip address input operation described with reference to FIGS. 8 and 9 may be summarized as follows.

Figure 10:
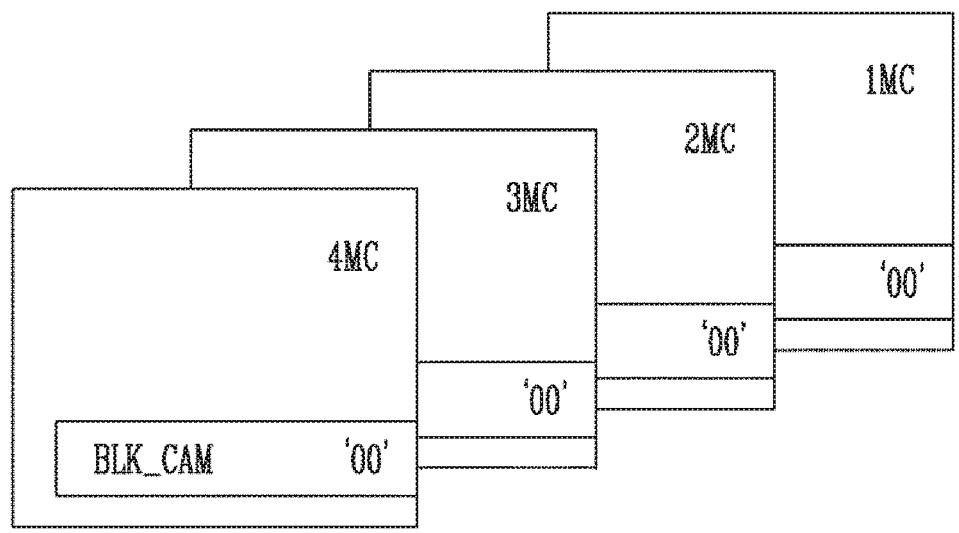
FIGS. 10 to 12 are diagrams illustrating memory chips to which chip addresses are inputted, in accordance with an embodiment of the present disclosure.
Figure 11:
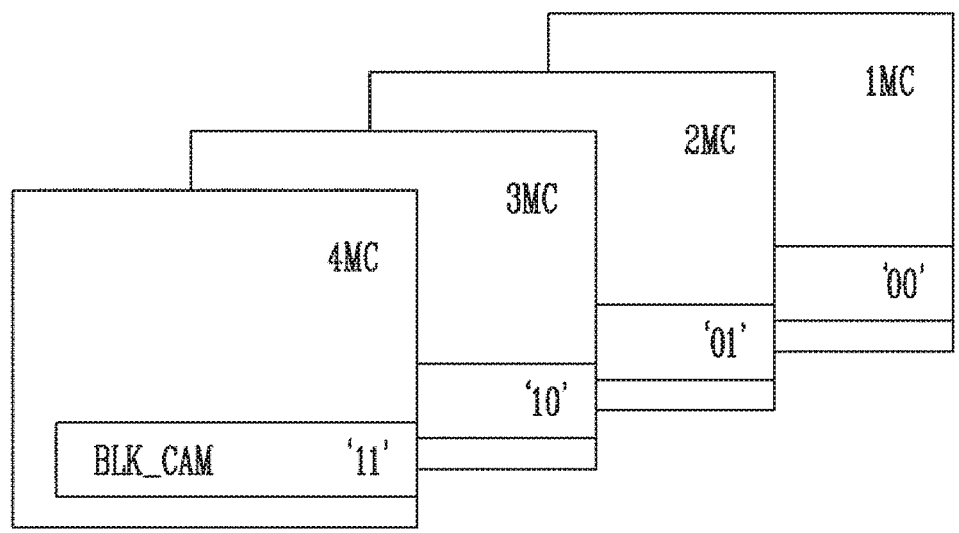
Figure 12:
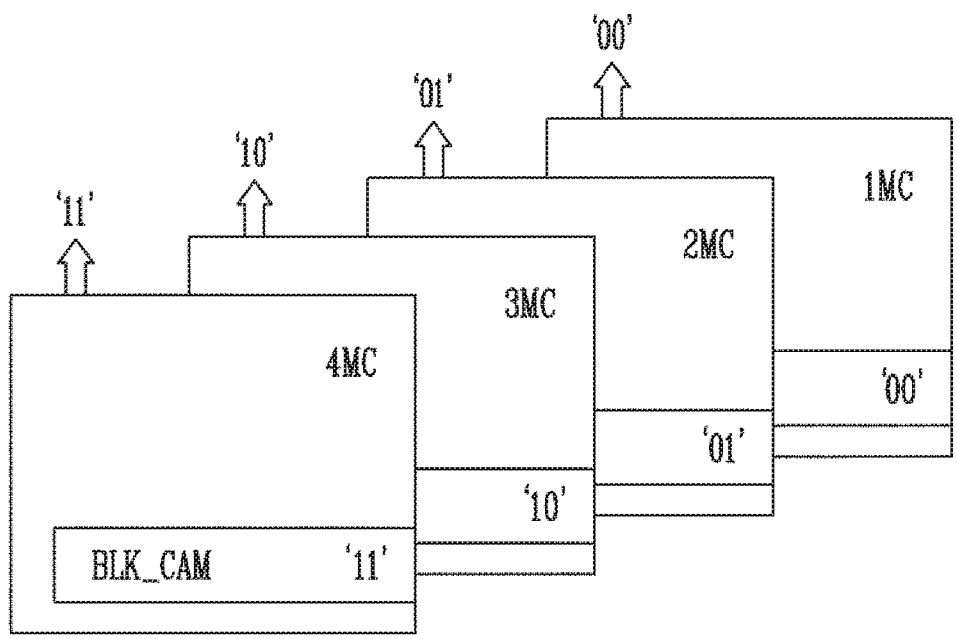

FIGS. 10 to 12 are diagrams illustrating memory chips to which chip addresses are inputted in accordance with an embodiment of the present disclosure. Four memory chips will be described by way of example.

Referring to FIG. 10, until the chip address input operation is performed after the packaging, all chip addresses may be initialized to '00' in the respective cam blocks BLK_CAM of the first to fourth memory chips 1MC to 4MC.

Referring to FIG. 11, after the chip address input operation (refer to FIGS. 8 and 9) has been performed, different chip addresses may be stored to the respective cam blocks BLK_CAM of the first to fourth memory chips 1MC to 4MC. For example, '00' may be stored as the first chip address to the cam block BLK_CAM of the first memory chip 1MC, '01' may be stored as the second chip address to the cam block BLK_CAM of the second memory chip 2MC, '10' may be stored as the third chip address to the cam block BLK_CAM of the third memory chip 3MC, and '11' may be stored as the fourth chip address to the cam block BLK_CAM of the fourth memory chip 4MC.

Referring to FIG. 12, in order to determine the chip addresses of the first to fourth memory chips 1MC to 4MC, a read operation may be performed on the cam blocks BLK_CAM in which the first to fourth chip addresses have been stored.

The above-mentioned chip address input method may be applied not only to the operation of storing chip addresses to the memory chips but also to an operation of different chip information to the respective memory chips.

In various embodiments of the present disclosure, chip addresses may be stored to memory cells of a memory region of a memory chip rather than to a pad region, so that there is no need to provide pads for distinguishing the chip addresses in the pad region of the memory chip. Therefore, the size of the memory chip may be reduced.

In various embodiments of the present disclosure, the size of a multi-chip package device may be reduced by reducing the number of pads of memory chips to be mounted in the multi-chip package device.

Exemplary embodiments of the present invention have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory chip comprising:
    a plurality of memory blocks each including a plurality of memory cells for storing data;
    a plurality of input/output pads to which a chip address is inputted;
    a plurality of peripheral circuits configured to program the chip address to a selected memory block among the memory blocks; and
    an enable input pad and an enable output pad,
    wherein an input state of the chip address is determined by signals applied to the enable input pad and the enable output pad.

2. The memory chip according to claim 1, wherein a command and a memory block address are inputted through the input/output pads.

3. The memory chip according to claim 2, further comprising a control circuit configured to control the peripheral circuits to program the chip address to the selected memory block in response to the command and the memory block address.

4. The memory chip according to claim 3, wherein the memory block address indicates the selected memory block.

5. The memory chip according to claim 1,
    wherein, if low-level signals are applied to the enable input pad and the enable output pad, the memory chip is in a state previous to input of the chip address,
    wherein, if signals applied to the enable input pad and the enable output pad have different levels, the memory chip is in a selected state to input the chip address, and wherein, if high-level signals are applied to the enable input pad and the enable output pad, the memory chip is in a state subsequent to the input of the chip address.

6. A package device, comprising:

a plurality of memory chips, each including memory blocks to which different chip addresses are stored, and enable input pads and enable output pads to which signals for indicating input states of the chip addresses are applied, wherein each of the memory chips includes any one of the enable input pads, and any one of the enable output pads, wherein the enable input pad included in each of the memory chips is coupled to the enable output pad of a corresponding one of the other memory chips, wherein, in response to signals applied to the enable input pads and the enable output pads, the chip addresses are successively inputted to the memory chips, and wherein the enable output pad included in a memory chip to which the chip address is lastly inputted among the memory chips is not coupled to any one of the enable input pads of the other memory chips.

7. The package device according to claim 6, wherein the enable input pad included in a first memory chip to which a corresponding one of the chip addresses is first inputted among the memory chips remains floating rather than being coupled to any one of the enable output pads of the other memory chips.

8. The package device according to claim 7, wherein an internal output of the enable input pad of the first memory chip remains at a positive voltage level.

9. The package device according to claim 8, wherein, when the chip address is applied to the first memory chip, the first memory chip maintains a potential of the enable output pad of the first memory chip at a low-level.

10. The package device according to claim 9, wherein after the chip address is inputted, the first memory chip transitions, the potential of the enable output pad of the first memory chip to a high-level.

11. The package device according to claim 9, wherein, when the potential of the enable output pad of the first memory chip makes a transition to a high-level, a second memory chip having an enable input pad to which the enable output pad of the first memory chip is coupled is selected.

12. The package device according to claim 6, wherein the memory blocks to which the chip addresses are stored are CAM blocks included in the respective memory chips.

13. The package device according to claim 12, wherein each of the cam blocks stores data to be used in the corresponding memory chip.

14. The package device according to claim 6, wherein the memory chips are stacked on top of one another.

15. A method of operating a package device, comprising:

a packaging operation of coupling enable input pads and enable output pads included in a plurality of memory chips to each other; and successively programming chip addresses to the memory chips by controlling signals to be applied to the enable input pads and the enable output pads, wherein the successively programming of the chip addresses comprises:

selecting any one memory chip of the memory chips;

programming a chip address to the selected memory chip; and selecting a subsequent memory chip adjacent to the selected memory chip.

16. The method according to claim 15, wherein, when all of the chip addresses are inputted to the memory chips, potentials of the enable input pads and the enable output pads of the memory chips transition to a high-level.

* * * * *